United States Patent [19]

Hill

[11] Patent Number: 4,608,096

[45] Date of Patent: Aug. 26, 1986

[54] GETTERING

[75] Inventor: Dale E. Hill, Kirkwood, Mo.

[73] Assignee: Monsanto Company, St. Louis, Mo.

[21] Appl. No.: 736,203

[22] Filed: Jun. 28, 1985

Related U.S. Application Data

[63] Continuation of Ser. No. 481,597, Apr. 4, 1983, abandoned.

[51] Int. Cl.[4] .......................................... H01L 21/324
[52] U.S. Cl. ..................................... 148/33; 148/33.3; 148/DIG. 60; 29/571; 156/DIG. 66
[58] Field of Search ................ 29/571, 576 T; 148/33, 148/33.3, 33.4, 174, 175, DIG. 60; 156/DIG. 66

[56] References Cited

U.S. PATENT DOCUMENTS 4,053,335 10/1977 Hu ........................................ 148/174

Primary Examiner—Brian E. Hearn
Assistant Examiner—David A. Hey
Attorney, Agent, or Firm—P. L. Passley

[57] ABSTRACT

Semiconductor substrate materials, such as silicon, useful in the manufacture of electronic devices, such as integrated circuits, employing low temperature, i.e., below 1025° C. processing cycles are provided with a 0.05 to 2.0 micron thick layer of polysilicon on the backside to improve gettering capabilities of defects, contaminants and impurities away from the active device region of the substrate.

25 Claims, No Drawings

GETTERING

This is a continuation of application Ser. No. 481,597, filed Apr. 4, 1983, abandoned.

BACKGROUND OF THE INVENTION

1. Field of the Invention

This invention relates to the manufacture of electronic devices such as integrated circuits. Particularly, this invention relates to improved semiconductor substrate materials, such as silicon wafers, used in the manufacture of integrated circuit devices. Specifically, this invention is directed to semiconductor substrate materials having enhanced ability for gettering deleterious impurities, contaminants and defects during device manufacture away from the region of device formation.

In the manufacture of integrated circuit devices on silicon wafers, the presence of and introduction of defects, contaminants and impurities on and near the device formation surface of the wafer creates excessive current leakages which greatly affects the yield of usable devices obtained. The art has recognized that the deleterious defects, contaminants and impurities can be to some extent relocated to non-harmful regions in the substrate material away from the device formation region. The methods and processes for diffusing and trapping the defects, contaminants and impurities away from the active device region both prior to and during device formation are termed gettering in the electronics industry and art.

2. Description of the Prior Art

Several techniques and processes for gettering in semiconductor materials to improve device yields have been disclosed in the art. Known gettering techniques and processes for semiconductor materials can be generally classified as based on external or internal means.

External gettering involves modifying the backside surface of the wafer to provide sites to which the defects, contaminants and impurities are attracted. A presently commercially used external gettering technique is to introduce mechanical damage to the backside of the wafer. The mechanical damage is imparted to the backside of the wafer by scratching the surface or sanding or grinding with an abrasive means to alter the crystalline structure and impart imperfections which attract and trap defects, contaminants and impurities away from the active device region of the wafer. Although backside damaged wafers provide gettering, the damage to the wafer creates additional problems in fragility, handling and cleaning to remove particulates formed and the damaged area provides potential traps for holding fluids and materials employed in the device manufacturing process which can result in further wafer contamination. U.S. Pat. No. 4,144,099 describes wafer gettering by employing backside mechanical damage.

Another example of external gettering is described in U.S. Pat. No. 3,997,368 wherein a stressed layer of silicon nitride or aluminum oxide is formed on the backside of the wafer which is then annealed to cause stacking fault nucleation sites to diffuse to the backside. Still another example is described in U.S. Pat. No. 3,929,529 wherein a surface of the wafer is anodized to form a layer of porous silicon, the contaminants are diffused from the body of the wafer to the porous silicon and the porous silicon layer is then oxidized to silicon dioxide.

U.S. Pat. No. 4,053,335 discloses a means of external gettering in semiconductor materials by providing a layer of polysilicon on the backside of the wafer. The grain boundaries of the polysilicon provide sites for segregation of impurities from the substrate. As the polysilicon grain boundaries are not annealed out at high temperature, the gettering capabilities remain effective throughout high temperature processing used in device manufacture.

Other commonly employed external type gettering means utilize boron- or phosphorus-doped semiconductor materials, ion implantation, such as argon, or heavy diffusion of impurities, such as boron and phosphorus, into the substrate material. U.S. Pat. No. 3,874,936 provides a description of the latter technique.

More recently, the gettering effect of oxygen contained in the substrate material has been reported in "Solid State Technology", July 1981, pages 55–61, and is referred to as internal gettering. Oxygen is present in Czochralski grown silicon as it is introduced to the crystal from the dissolution of the quartz crucible employed to hold the silicon melt during crystal pulling. The precipitation of oxygen contained in the substrate material can form useful sites for gettering deleterious defects, contaminants and impurities.

With any gettering means, the active region of the substrate material where the devices are formed must be free of gettering sites. Thus, a zone about 10–25 microns and preferably about 15–20 microns in depth from the device surface of the wafer which is denuded of gettering sites must be created to prevent device yield loss from defect interference. The oxygen concentration in a substrate material can be reduced near the surface through outward diffusion at the process thermal conditions employed in device manufacture.

With the rapidly advancing device manufacturing technology and particularly with respect to complex and lengthy processing steps and increased circuit density and total circuit size on a wafer, it has become apparent improvements are needed in the gettering capabilities of substrates to cope with the increased requirements and provide effective gettering throughout the device processing steps in order to achieve an acceptable yield of good devices per wafer.

SUMMARY OF THE INVENTION

Typical objects of this invention are to provide:
1. a semiconductor substrate having improved gettering capabilities,
2. a semiconductor substrate which provides both internal and external gettering capabilities,
3. a semiconductor substrate exhibiting enhanced gettering capabilities throughout device processing cycles, and
4. a semiconductor substrate which exhibits reduced defect formation in the active device region and provides increased minority carrier lifetime.

Other objects, characteristics and advantages of this invention will become apparent to those skilled in the art from this disclosure and appended claims.

In accordance with this invention, an improved semiconductor substrate is provided which exhibits enhanced gettering capabilities throughout device manufacturing cycles, imparts improved minority carrier lifetime and reduces yield loss of devices made due to deleterious defects, contaminants and impurities. The enhanced gettering capabilities are imparted to the semiconductor wafer through a layer of doped polysilicon on the backside of the wafer. Any element can be used to dope the polysilicon in accordance with this invention which does not readily diffuse to the device region of the wafer. Nonlimiting examples of suitable elements are oxygen, nitrogen, germanium, tin, and carbon. These elements can be employed with the polysilicon alone or in combinations of two or more of the elements.

Oxygen-doped polysilicon is referred to in the electronics industry as SIPOS (semi-insulating polycrystalline-silicon). Thermally deposited SIPOS has been used as passivation films on devices and has received considerable attention in the literature. An early article "Semi-Insulating Polycrystalline-Silicon (SIPOS) Films Applied to MOS Integrated Circuits" by H. Mochizuki et al in the supplement to *Japanese Journal of Applied Physics*, Vol. 15, 1976, pages 41–48, discusses the use of SIPOS films for the surface passivation of integrated circuits. Another article discussing the two phases—silicon microcrystals and silicon oxide—of SIPOS is "Crystallographic Study Of Semi-Insulating Polycrystalline Silicon (SIPOS) Doped with Oxygen Atoms", by M. Hamasaki et al is found in *J. Appl. Phys.*, 49(7), July 1978, pages 3987–3992. An article "A Model Of SIPOS Deposition Based On Infrared Spectroscopic Analysis", by W. R. Knolle et al in *J. Electrochem. Soc., Solid-State Science and Technology*, October 1980, pages 2254–2259, discusses deposition of SIPOS at atmospheric and low pressures.

SIPOS is deposited on semiconductor substrate materials, such as silicon wafers, by the well known chemical vapor deposition (CVD) technology wherein the reactant in vapor form is thermally decomposed or reduced using hydrogen or other known reducing agents. SIPOS is deposited by using a reactant of a silicon-containing material, such as silane or chlorinated silicon such as trichlorosilane, and an oxygen-containing material. The oxygen-containing material can be a non-metallic oxygen-containing complex such as oxides of nitrogen, carbon and hydrogen, and oxidizing agents such as a phosgene as well as oxygen itself. The oxygen content of the deposited SIPOS film can be regulated by controlling the ratios of the silicon and oxygen in the reactant gas.

An oxygen-doped polysilicon layer on the wafer creates a strain resulting in a degree of bow or warpage in the wafer. The level of strain introduced is in part dependent upon the temperature at which the polysilicon layer is applied, the oxygen content of the layer, and the deposition pressure and rate. Suitable oxygen-doped polysilicon layers for the purpose of this invention can be deposited onto the wafers at temperatures generally within the range of 600°–800° C. Deposition occurs at lower temperatures, but below about 600° C. the deposition is too slow to be economically practical, and deposition can occur at higher temperatures, but above about 800° C. control problems can occur particularly when using silane as a reactant. The effect of the level of oxygen doping of the polysilicon layer on the strain introduced and resulting bow or warpage varies with the deposition conditions employed.

In accordance with this invention, effective gettering is obtained utilizing various thicknesses of doped polysilicon layers on the backside of the substrate materials. Generally, the layer thickness can range broadly from 0.05 to 5.0 microns, preferably from 0.2 to 2.0 microns, and more specifically from 0.6 to 1.0 microns. The dopant concentration in the layer can also vary on a broad range while achieving gettering capability. Generally dopant concentrations can broadly range from 0.1 to 40 weight percent, preferably from 2 to 20 weight percent, and more specifically from 4 to 10 weight percent.

DESCRIPTION OF PREFERRED EMBODIMENTS

In the following Examples, a low pressure chemical vapor deposition (LPCVD) reactor of the type described in articles by M. L. Hitchman and J. Kane in the *J. of Crystal Growth*, 55,485 (1981) and by M. L. Hitchman, J. Kane and A. E. Widmer in *Thin Solid Films*, 59,231 (1979) is used. The wafer carrier employed is simply an elongated boat device having outwardly slanting transversely grooved sides and open at the bottom for holding a plurality of wafers on edge and parallel to each other with about 3/16-inch spacing between wafers. The reactor is operated at 680° C. unless otherwise specified. The feed is silane and $N_2O$ and is introduced at the rates indicated. The reactor is operated at the indicated pressures by pulling a vacuum on the system using a 26.8 CFM pump.

Silicon wafers which have been lapped and chemically etched by conventional commercial technology are used. SIPOS layers are deposited on both sides of the wafers in the reactor. It is to be understood that deposition of oxygen-doped polysilicon only on one side of the wafer is sufficient for purposes of this invention. The thickness of the SIPOS layers deposited on the wafers is controlled by regulating the deposition time in the reactor. Under the conditions employed using 3" wafers, a 0.8 micron thick layer is deposited in 48 minutes and a 1.5 micron thick layer is deposited in 91 minutes. The wafers, after removal from the furnace, are further processed using conventional technology. The deposited SIPOS layer is polished off the front side of the wafer leaving a SIPOS layer on the backside of the wafer.

MOS capacitors are prepared on the candidate wafers which have been cleaned by standard techniques. A 1,000 Å thick oxide surface layer is formed on each wafer by loading the wafers into a furnace at 800° C. at 6 inches per minute in an $N_2+10\%$ $O_2$ atmosphere, the temperature is raised to 1,000° C. at 10° per minute, oxidized in dry oxygen for 130 minutes, annealed in nitrogen for 30 minutes, reducing the temperature at 1° C. per minute to 600° C. in a nitrogen atmosphere, annealing in the presence of the forming gas for 30 minutes at 600° C. and removing from the furnace at 6 inches per minute. Capacitors are formed by conventional aluminum evaporation and photolithographic techniques. MOS lifetimes are determined from capacitance measurements as a function of time after depleting the device with an electrical pulse using the well known method of M. Zerbest [Z. Agnew Physics, 22, 30(1966)].

EXAMPLE I

MOS capacitors are formed on a number of silicon wafers either having a polysilicon or a SIPOS layer on the backside prepared as described above under conditions set forth in Table 1 and standard wafers, as control. MOS generation lifetimes are determined as described above and the average of the results for like test wafers are reported in Table 1.

TABLE 1

| Wafer | DEPOSITION CONDITIONS | | | | | Thickness Microns | Generation Lifetimes Milliseconds |
|---|---|---|---|---|---|---|---|
| | SiH$_4$ (cc/min) | N$_2$O (cc/min) | Temp. (°C.) | Pressure (mm of Hg) | Time (min) | | |
| A (Control) | — | — | | | | | 0.7 |
| B | 55 | — | 680 | 300 | 90 | 1.54 | 1.8 |
| C | 55 | 1.9 | 680 | 300 | 80 | 1.45 | 3.4 |
| D | 55 | 8.5 | 680 | 320 | 110 | 1.82 | 6.0 |

From the above data it is seen that generation lifetime increases as the thickness of the SIPOS layer and oxygen content increases and is more than double that obtained with only a polysilicon layer.

EXAMPLE II

Wafers having varying oxygen content SIPOS layers applied to the backside are prepared to demonstrate that the amount of oxygen in the SIPOS layer has an effect on, and can be used to control, wafer distortion known as bow. Bow is simply the deviation of the wafer from flatness in the unclamped state, without holding the wafer on a vacuum chunk. Bow is measured by supporting the wafer on 3 points near the edge of the back and measuring the position of the center of the front of the wafer. The wafer is then turned over and the change in elevation of the center of the wafer is noted. The value of the change divided by two is known as the bow of the wafer. If the polished side is concave, the wafer is known as dished and if it is convex the wafer is called a bowed wafer.

The SIPOS layers are applied to the silicon wafers using the reactor as described above. The temperatures along the reactor range from 624° C. at the door to 655° C. in the middle and 695° C. at the pump end. Sample wafers were placed at positions where the above temperatures were measured in order to obtain a variety of oxygen compositions since the oxygen uptake of nitrous oxide versus the silane are different. A constant rate of 80 cc/min. of silane is feed. The difference in oxygen uptake occurs since the silane and nitrous oxide deplete at different rates. The actual layer compositions were determined analytically using electron microprobe by measuring the X-rays emitted when the sample was excited with an electron beam. The energy of the electron beam was kept low so that the electron penetration, throughout the analysis, was limited to the SIPOS deposited layer. The conditions used and the results of these procedures are given in Table II.

TABLE II

| WAFER | DEPOSITION CONDITIONS | | | | PROPERTIES | | |
|---|---|---|---|---|---|---|---|
| | TEMP. (°C.) | N$_2$O (cc/min) | TIME (Min) | PRESSURE (mm of Hg) | O$_2$ IN SIPOS (wt %) | THICKNESS MICRONS | BOW Mils |
| A | 624 | 3.1 | 120 | 650 | 2.35 | 1.3 | 1.16 |
| B | 655 | 3.1 | 120 | 650 | 2.45 | 1.6 | 1.28 |
| C | 695 | 3.1 | 120 | 650 | 2.92 | 2.8 | 1.60* |
| D | 624 | 0 | 100 | 700 | 0 | 1.4 | 0.54 |
| E | 655 | 0 | 100 | 700 | 0 | 1.6 | 0.53 |
| F | 695 | 0 | 100 | 700 | 0 | 1.6 | 0.41 |

*Polished side of wafer convex box, all others concave bow.

The results indicate the effect of oxygen content on inducing bow to the wafer as well as the quantity of oxygen on the type of bow. Thus, the oxygen content can be regulated to control bow of the wafer.

The above Examples used standard P<100> type silicon wafers and oxygen-doped polysilicon layers. However, SIPOS layers and other doped polysilicon layers on any crystalline P or N type wafer provide improved gettering of deleterious defects, contaminants and impurities. Typical gettering improvements from SIPOS backside layers as indicated by generation lifetime will be at least about 4 times that of standard P<100> type wafers and at least about 1.5 times that of standard P<111> type wafers.

This invention, in addition to providing the Electronics industry an improved semiconductor substrate, permits control of semiconductor substrate characteristics such as denuded zone depth and oxygen precipitation through SIPOS backside layer thickness in relation to the specific requirements dictated by downstream needs and manufacturing conditions, such as particular device requirements and processing temperatures.

Although the foregoing description has emphasized gettering improvement with reference to specific embodiments, the use of a doped polysilicon layer on the backside of a semiconductor substrate provides an improved substrate free of surface defects, contaminants and impurities useful in epitaxial deposition of coatings, such as silicon, onto the semiconductor substrate. It is therefore to be understood that changes and modifications in form and detail of the invention and specific utilization thereof may be made without departing from the spirit and scope of the invention and appended claims. For example, the doped polysilicon layer can be applied to the backside of the substrate prior to or during device formation. Also, doped amorphous silicon layers could be employed instead of doped polysilicon layers as the amorphous form readily converts to crystal form at the temperatures utilized for electronic device formation.

What is claimed is:

1. A semiconductor substrate with capability for gettering defects, contaminants and impurities deleterious to electronic devices to a region away from the active device region consisting essentially of a semiconductor material having a 0.05 to 5.0 microns thick layer on the backside of the substrate from the device region of polysilicon containing a dopant element in an amount of 0.1 to 40 weight percent of said layer.

2. The substrate of claim 1 wherein the thickness of said doped polysilicon layer is from 0.2 to 2.0 microns.

3. The substrate of claim 1 wherein the thickness of said doped polysilicon layer is from 0.6 to 1.0 micron.

4. The substrate of claim 1 wherein said dopant is oxygen.

5. The substrate of claim 1 wherein said dopant is nitrogen.

6. The substrate of claim 1 wherein the dopant element is present in said layer in an amount of from about 2 to 20 weight percent of said layer.

7. The substrate of claim 1 wherein the dopant element is present in said layer in an amount from about 4 to 10 weight percent of said layer.

8. The substrate of claim 1 wherein semiconductor material is silicon.

9. The substrate of claim 1 wherein said doped polysilicon layer is applied to said semiconductor material by chemical vapor deposition of a silicon containing material in the presence of a dopant material.

10. The substrate of claim 9 wherein said silicon-containing material is silane.

11. The substrate of claim 9 wherein said silicon-containing material is silane and said dopant material is nitrogen oxide.

12. A semiconductor substrate with capability for gettering defects, contaminants and impurities deleterious to electronic devices to a region away from the active device region consisting essentially of a silicon wafer having one mirror-like surface and a 0.2 to 2.0 microns thick layer of oxygen-doped polysilicon containing 0.1 to 40 weight percent oxygen covering the other surface.

13. The substrate of claim 12 wherein said layer is from 0.6 to 1.0 micron thick.

14. The substrate of claim 12 wherein oxygen is present in said layer from about 2.0 to about 20 weight percent of said layer.

15. The substrate of claim 12 wherein oxygen is present in said layer from about 4.0 to about 10 weight percent of said layer.

16. A process for manufacturing electronic devices using thermal processing conditions wherein the devices are formed on one surface of a substrate consisting essentially of a semiconductor material having a backside layer of polysilicon containing a dopant element in an amount of 0.1 to 40 weight percent of the layer.

17. The process of claim 16 wherein the doped polysilicon layer has a thickness from 0.05 to 5.0 microns.

18. The process of claim 17 wherein said thickness is from 0.2 to 2.0 microns.

19. The process of claim 17 wherein said thickness is from 0.6 to 1.0 micron.

20. The process of claim 16 wherein said semiconductor material is silicon.

21. The process of claim 16 wherein said dopant element is oxygen present in said layer in an amount from 2.0 to 20 weight percent.

22. The process of claim 16 wherein said dopant element is oxygen present in said layer in an amount from 4.0 to 10 weight percent.

23. A process of manufacturing electronic devices wherein the devices are formed under thermal conditions on and near one surface of a silicon wafer having a layer consisting essentially of oxygen-doped polysilicon on the other surface, the layer of oxygen-doped polysilicon having a thickness from 0.2 to 2.0 microns and an oxygen content of from 0.1 to 40 weight percent.

24. The process of claim 23 wherein said thickness is from 0.6 to 1.0 micron.

25. The process of claim 23 wherein said oxygen is present in said layer in an amount from 2.0 to 20 weight percent.

* * * * *